(12) United States Patent
Knechten et al.

(10) Patent No.: US 9,272,512 B2
(45) Date of Patent: Mar. 1, 2016

(54) PRINTING METHOD FOR PRINTING A FUNCTIONAL PATTERN AND A PRINTING APPARATUS

(71) Applicant: OCE-TECHNOLOGIES B.V., Venlo (NL)

(72) Inventors: Karel Knechten, Broekhuizen (NL); Hylke Veenstra, Reuver (NL); Matheus Wijnstekers, Velden (NL)

(73) Assignee: OCE-TECHNOLOGIES B.V., Venlo (NL)

( * ) Notice: Subject to any disclaimer, the term of this patent is extended or adjusted under 35 U.S.C. 154(b) by 0 days.

(21) Appl. No.: 14/550,583

(22) Filed: Nov. 21, 2014

(65) Prior Publication Data

US 2015/0077450 A1   Mar. 19, 2015

Related U.S. Application Data

(63) Continuation of application No. PCT/EP2013/059572, filed on May 8, 2013.

(30) Foreign Application Priority Data

May 23, 2012   (EP) .................................... 12169001

(51) Int. Cl.
  *B41J 3/00* (2006.01)
  *B41J 2/045* (2006.01)
  *H05K 3/12* (2006.01)
  *B41J 3/407* (2006.01)

(52) U.S. Cl.
  CPC .............. *B41J 2/04593* (2013.01); *B41J 3/407* (2013.01); *H05K 3/125* (2013.01)

(58) Field of Classification Search
  CPC ............................ H05K 3/1241; H05K 3/125
  See application file for complete search history.

(56) References Cited

U.S. PATENT DOCUMENTS

| | | | | |
|---|---|---|---|---|
| 7,866,779 | B2* | 1/2011 | Martinez ................ | B41J 2/2142 347/13 |
| 2004/0241586 | A1* | 12/2004 | Hirai et al. ..................... | 430/311 |
| 2005/0212834 | A1* | 9/2005 | Akahira et al. .................... | 347/5 |
| 2006/0169672 | A1* | 8/2006 | Toyoda ........................... | 216/67 |
| 2006/0260543 | A1* | 11/2006 | Hiruma et al. ................ | 118/667 |
| 2014/0374375 | A1* | 12/2014 | Zwiers et al. .................... | 216/13 |

FOREIGN PATENT DOCUMENTS

| | | |
|---|---|---|
| EP | 0 962 318 A1 | 12/1999 |
| GB | 2 330 451 A | 4/1999 |
| JP | 2007-755 A | 1/2007 |
| WO | WO 02/01929 A2 | 1/2002 |
| WO | WO 2005/022969 A2 | 3/2005 |

* cited by examiner

*Primary Examiner* — Shelby Fidler

(74) *Attorney, Agent, or Firm* — Birch, Stewart, Kolasch & Birch, LLP

(57) ABSTRACT

In a method for printing a functional pattern using a printing apparatus, the printing apparatus applying a recording material on a substrate, the method includes determining a first part and a second part of the functional pattern, and controlling the printing apparatus such to apply a first amount of the recording material per unit area on the substrate to cover the first part and a second amount of the recording material per unit area on the substrate to cover the second part, wherein the first amount is larger than or equal to an amount sufficient to cover the substrate per unit area and the second amount is larger than the first amount. A printing apparatus includes a print head and a control unit. The control unit is configured to have the printing apparatus to execute the method for printing.

13 Claims, 8 Drawing Sheets

PRINTING METHOD FOR PRINTING A FUNCTIONAL PATTERN AND A PRINTING APPARATUS

CROSS-REFERENCE TO RELATED APPLICATIONS

This application is a Continuation of International Application No. PCT/EP2013/059572, filed on May 8, 2013, and for which priority is claimed under 35 U.S.C. §120. PCT/EP2013/059572 claims priority under 35 U.S.C. §119(a) to Application No. 12169001.0, filed in Europe on May 23, 2012. The entire contents of each of the above-identified applications are hereby incorporated by reference into the present application.

BACKGROUND OF THE INVENTION

1. Field of the Invention

The present invention relates to a method for printing a functional pattern using a printing apparatus, the printing apparatus applying a recording material on a substrate.

2. Description of Background Art

A printing apparatus may be used to print a functional pattern of recording material on a substrate. Such recording material may be a fluid like ink, a substance like toner or another kind of material like metal or silicon. In case of an inkjet apparatus, drops of recording material are ejected by a plurality of printing elements of a print head of the inkjet apparatus on a substrate. The functional pattern of recording material may form an image of pixels, each pixel comprising at least one ink dot. Such an image may form a mask for producing an electrical device. Even a three-dimensional image may be printed. Electronic devices such as solar cells, printed circuit boards and OLED lighting devices are considered.

The print head and the substrate may be moved relative to one another in at least one direction, for example a main scanning direction or a main scanning direction in combination with a sub-scanning direction, in such a manner that a location on the substrate determined for a dot of the image according to the digital data is exposed to at least one printing element of the print head.

In some industrial applications, at first a patterned conductive layer is printed, which is intended to be etched afterwards. This process is also known as etching. For example, direct printing of an electrical circuit on a substrate to achieve a printed circuit board may be established via etching.

In some other industrial applications, at first a mask is printed by an inkjet apparatus on a substrate, which serves as a base for an electrical device. Gaps in the mask are filled with a conducting material in order to form electrical circuits of the electrical device. After the gaps are filled, the mask is removed from the substrate. This process is also known as plating. For example, printing a negative mask on a substrate for a solar cell allows for a plating process to create conductive electrodes on those parts of a wafer where no ink was printed.

An inkjet apparatus may occasionally have failing nozzles. A nozzle is a printing element of a print head from which an ink drop is ejected on the substrate. Usually, a nozzle ejects ink on a line on the substrate when the print head is moving over it.

Missing drops of recording material resulting in a missing line, due to a failing nozzle may result in unwanted creation of isolated parts of the electrical device. When the printing of the conductive recording material is intended to form a conductive layer for an electrical device, a failing nozzle may isolate a part of the conducting layer. For example, when producing a ground layer for a printed circuit board, a large area is concealed by means of the mask. If a failing nozzle results in an open line in the middle of the mask, this open line will become a fracture line inside the ground layer after etching. This ground layer does not function well since one part of the ground layer remains floating, when the other part is electrically connected to the ground. Such a malfunctioning ground layer may occur when producing an electronic device like a solar cell, a printed circuit board as well as an OLED lighting device.

Missing drops of recording material resulting in a missing line in a mask for an electrical device due to a failing nozzle may create unwanted conductive parts of the electrical device. For example, on the surface of a solar cell this results in a slightly lower efficiency of the finished solar cell, which is no problem.

However, a missing line on an edge of the solar cell may result in a formation of a conductive track from a front side of the solar cell to a backside of the solar cell, resulting in a non-functioning solar cell. An electrically insulated edge is a critical part of the solar cell with regard to current shortage or leakage. A part of an electrical device that is located between two sections of the electronic device, which have to remain electrically separated, may also be a critical part. Such a destructive conducting path between two sections is also known as a short.

When a missing line is detected, the print head is moved to a cleaning unit according to the background art in order to clean the nozzle, which is responsible for the missing line. Such a cleaning will cost productivity due to the extra cleaning time. Also, additional printing swathes have to be made, which lowers an end product throughput and machine productivity. In case of a one pass print strategy, detection of a missing line in a printing process may be too late to correct already printed parts of the mask. Only parts to be printed after the cleaning action will be corrected.

SUMMARY OF THE INVENTION

It is an object of the present invention to overcome these disadvantages when using a printing apparatus for printing a functional pattern.

This object is achieved by a method for printing a functional pattern using a printing apparatus, the printing apparatus applying a recording material on a substrate, the method comprising the steps of: determining a first part and a second part of the functional pattern; and controlling the printing apparatus to apply a first amount of the recording material per unit area on the substrate to cover the first part and a second amount of the recording material per unit area on the substrate to cover the second part, wherein the first amount is larger than or equal to an amount sufficient to cover the substrate per unit area and the second amount is larger than the first amount.

Printing at the second part of the substrate by the higher amount per unit area results in a higher coverage of the printed second part. If a print head of the inkjet apparatus has a failing printing element, ink flow from the part of the substrate printed at by adjacent printing elements to the part of the substrate intended to be printed by the failing printing element assures that a missing line due to the failing printing element is filled in by ink, which is additionally ejected at the second part by the adjacent printing elements. The second part may be selected to be a critical part of an electrical device to be directly printed, while the first part may be selected to be a non-critical part of an electrical device to be directly printed. The second part may be selected to be a critical part of an electrical device for which initially a mask is printed, while the first part may be selected to be a non-critical part of an electrical device for which the mask is initially printed.

According to an embodiment, the printing apparatus comprises a print head for applying the recording material by drops on the substrate and the method further comprises the step of controlling the printing apparatus to apply the second amount by using a higher resolution of drops than for applying the first amount. Such a printing apparatus may comprise a print head with a plurality of printing elements positioned in at least one array. The printing apparatus normally may eject recording material at a resolution that corresponds to the even printing elements in the array in order to fully cover the substrate.

According to an embodiment, the second part of the functional pattern is printed by ejecting recording material from both the even and odd printing elements in the array, while the first part of the functional pattern is printed by the even printing elements in the array only. By doing so, a resolution at the second part of the functional pattern on the substrate is twice as high as the resolution at the first part of the functional pattern on the substrate.

According to another embodiment, the step of ejecting recording material at a higher resolution is achieved by ejecting the recording material at a higher frequency.

The first part and second part of the functional pattern may be printed by the same printing elements. The second part of the functional pattern on the substrate is printed by the printing elements having an ejection frequency, which is higher than an ejection frequency of the printing elements, when printing the first part of functional pattern on the substrate. This method results in a more than sufficient coverage at the second part of the functional pattern on the substrate than at the first part of the functional pattern.

According to an embodiment, the printing apparatus comprises a print head for applying the recording material by drops on the substrate and the method further comprises the step of controlling the printing apparatus to apply the second amount by using a larger drop size than for applying the first amount. By ejecting a larger drop of recording material at the second part of the functional pattern on the substrate than at the first part of the functional pattern, the amount of ink ejected at the second part is accordingly higher than at the first part. This method results in a higher amount per unit area at the second part of the functional pattern on the substrate than at the first part of the functional pattern on the substrate. In case of a failing printing element, which prints at the second part of the functional pattern on the substrate, an empty space at the second part due to the failing printing element will be created. However, the superfluous amount of recording material ejected from the at least one neighboring printing element at the second part of the functional pattern with a larger drop size, covers the empty space in such a way that a full coverage is still reached at the whole second part.

According to an embodiment, the functional pattern is selected for forming an electrical circuit. Such a functional pattern may represent the electrical circuit itself or may represent a mask for the electrical circuit. If the functional pattern represents the electrical circuit itself, the recording material may be a conductive recording material like a metal in order to form a conductive electrical connection. If the functional pattern represents a mask for the electrical circuit, the recording material may be an isolating recording material like an isolating ink in order to form an isolating counter part of the electrical circuit.

According to an embodiment, the first part and the second part respectively correspond to an electrically non-critical part and an electrically critical part of the electrical circuit. For example, the second part comprises an edge of a mask or an edge of a gap in a mask. During solar cell production, an edge of the solar cell may be identified as a critical part. Therefore the edge of a mask for producing the solar cell is also identified as a critical part. Printing an edge of the mask at a higher amount per unit area will result in a mask, which is suitable for producing solar cells. The fully covered edge of the mask by the second amount prevents formation of a conductive connection over the edge from the front side of the solar cell to the back side of the solar cell. The cost of a slightly higher usage of recording material according to the present invention largely offsets a low yield of solar cell production. Another advantage is a higher substrate throughput without a need for mask integrity verification.

According to an embodiment, the step of applying the recording material on the substrate is established during one single pass of a print head of the printing apparatus, said one single pass covering the first part and the second part of the substrate.

Switching between a higher amount of recording material per unit area in the second part and a lower amount of recording material per unit area in the second part is realized on-the-fly during the one single pass of the print head over the substrate.

According to an embodiment, the step of applying the recording material on the substrate comprises a first sub-step of applying the recording material at the first part during a first pass of a print head of the printing apparatus over the substrate and a second sub-step of applying the recording material at the second part during a second pass of the print head of the printing apparatus over the substrate. This is advantageous in case a change of amount of recording material per unit area between the first part and the second part or vice versa, for example by means of a higher resolution or by means of a larger drop size may need time. The time between the first pass and the second pass may be used to switch from one amount per unit area to the other.

According to an embodiment, the step of applying the recording material on the substrate comprises a first sub-step of applying the first amount of recording material at the first part and at the second part during a first pass of a print head of the printing apparatus over the substrate and a second sub-step of applying an additional amount of recording material at the second part during a second pass of the print head of the printing apparatus over the substrate, the first amount and the additional amount together forming the second amount. This is advantageous, since during each sub-step the amount of recording material ejected per unit area may be selected to be constant.

According to an embodiment, the functional pattern represents a mask for the electrical circuit and the method further comprises the steps of filling gaps in the mask with a conducting material in order to form the electrical circuit; and removing the mask from the substrate.

The present invention also comprises a printing apparatus comprising a print head and a control unit, the control unit being configured to have the printing apparatus execute the method according to any of the previous embodiments.

The present invention also comprises a non-transitory recording medium comprising computer executable program code configured to instruct a computer to control a printing apparatus to perform the method according to any of the previous embodiments.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
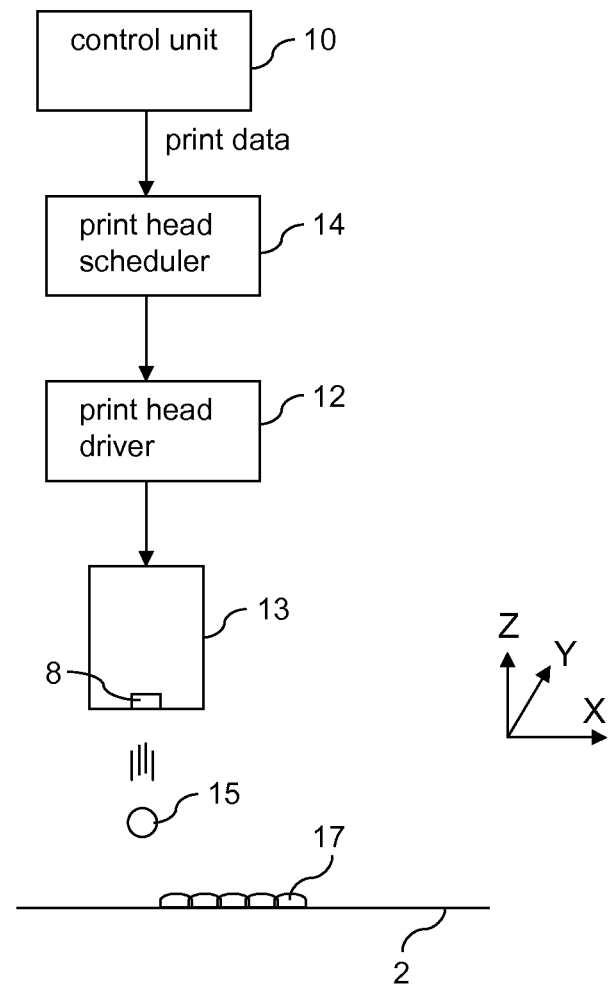
FIG. 1 is a schematic view of components of an inkjet apparatus for executing the method according to the present invention.

The present invention will now be described with reference to the accompanying drawings wherein the same or similar elements have been identified with the same reference numerals.

In FIGS. 1-7, the method according to an embodiment of the present invention will be elucidated by means of an inkjet apparatus. However, the method is also suitable for other kinds of printing apparatuses, which have been configured to apply different amounts of recording material per unit area on a substrate according to a functional pattern.

FIG. 1 is a schematic view of components of an inkjet apparatus according to a shown orthogonal XYZ orientation. The inkjet apparatus comprises a control unit 10, a print head 13, a print head driver 12 and a print head scheduler 14.

The print head 13 is moving in a first direction of the arrow X by means of a guiding mechanism (not shown), like a carriage, over a substrate 2, e.g. a sheet of paper, a wafer, a transparent material, copper clad, aluminium, polytetrafluoroethylene, indium tin oxide or silicon nitride. The print head 13 having a plurality of printing elements 8 is disposed above the substrate 2 and extends over at least a part of the width of the substrate 2 (in the direction indicated by arrow Y). As is generally known in the art, the printing elements 8 have actuators configured to cause the printing elements to eject droplets 15 of recording material onto the substrate 2 in a direction opposite to a direction indicated with the arrow Z, so as to print an image composed of dots 17 in accordance with print data supplied into the print head 13 by a control unit 10 of the inkjet apparatus. The printing elements 8 are arranged in one or more lines along the width of the substrate 2. According to FIG. 1, the width of the substrate 2 is in a direction Y, pointing inward of FIG. 1, perpendicular to the first direction X and perpendicular to a direction Z as indicated in FIG. 1. The printing elements 8 are in a certain raster on the print head 13, which defines amongst others the print resolution. Within the raster, a dot 17 may be formed in any width wise location on the substrate 2. The locations of the dots 17 on the substrate 2 in the first direction X are determined by the timings with which the individual printing elements are fired when the print head 13 moves past the substrate 2, and is also dependent on the position of a firing printing element in the raster on the print head 13. To move the print head 13 past the substrate 2 is in particular advantageous if the substrate 2 is of a significant mass such that a needed accurate movement of the print head 13 can be achieved while a same accurate movement of the substrate 2 cannot be guaranteed. In an alternative embodiment, the substrate 2 moves past the print head 13. In case of a color printer, besides the print head 13, other print heads (not shown) may include a suitable array of printing elements 8 for other colors.

Print data that specify the image to be printed are supplied to a print head driver 12, which causes the individual printing elements 8 of the print head 13 to fire at appropriate timings. By way of example, it may be assumed that the printing elements 8 or their actuators are capable of firing synchronously with a certain frequency, so that a pixel line of dots 17 is formed on the substrate 2 in each cycle forming an edge or an internal line of a linear element of the image to be printed. However, other printing strategies may be applied.

In the example shown, the print data are supplied to a print head scheduler 14, which specifies for each operating cycle of the print head 13 which of the printing elements 8 has to be actuated. Instruction signals are sent from the print head scheduler 14 to the print head driver 12, so that the image that is actually printed with the print head 13 consists of dots specified by the print data.

FIGS. 2A-2F are schematic views of printing dots being part of an image to be printed by means of the inkjet apparatus of FIG. 1.

Figure 2A:
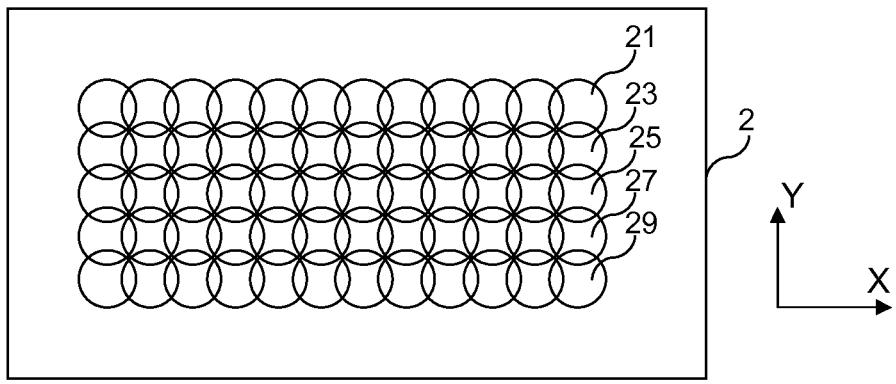
FIGS. 2A-2F are schematic views of printing dots with the inkjet apparatus of FIG. 1.

FIG. 2A shows a part of the substrate 2. The print head 13 is moving in the X direction over the substrate 2. The print head 13 comprises an array of printing elements 8. For convenience reasons, FIG. 2A shows an image created by a print head having an array of 10 printing elements. In practice, the number of printing elements 8 in the array may be much larger, for example 256, 1024, 2048, etc. The printing elements 8 are ordered in an array and are divided into odd and even printing elements. Each odd printing element ejects a row of drops on the substrate, which rows are parallel to each other. The last drops of the rows are indicated as drop 21, drop 23, drop 25, drop 27 and drop 29, respectively. Firing with all odd printing elements guarantees a full coverage of the substrate 2. As shown in FIG. 2A, the drops partially overlap in the X direction and in the Y direction.

Figure 2B:
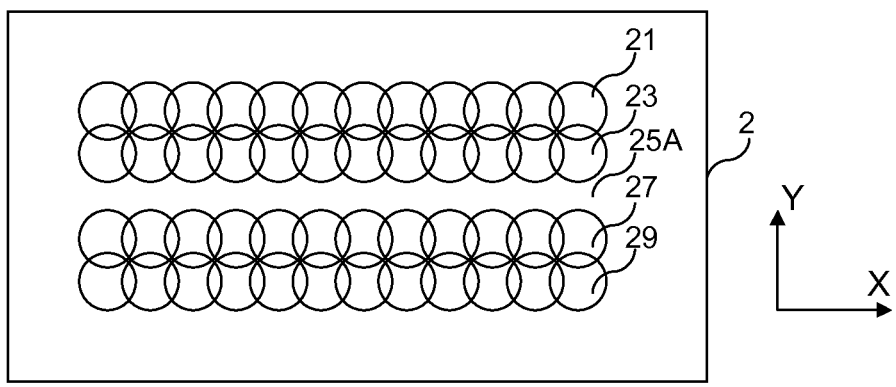

FIG. 2B shows the same part of the substrate 2. A row of drops of which the last drop was indicated as drop 25 in FIG. 2A, has not been printed due to a failing odd printing element. An area 25A, which is not covered by dots and extends in the X direction emerges from the printed image.

Figure 2C:
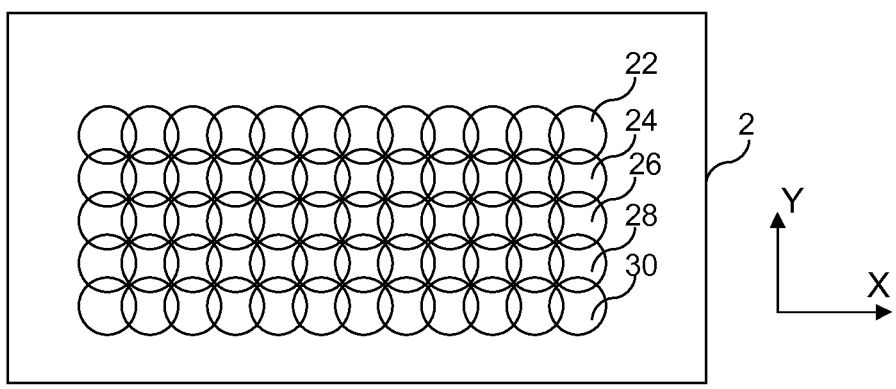

FIG. 2C shows the same part of the substrate 2. Each even printing element ejects a row of drops on the substrate, which rows are parallel to each other. The last drops of the rows are indicated as drop 22, drop 24, drop 26, drop 28 and drop 30, respectively. Firing with all even printing elements guarantees a full coverage of the substrate 2. As shown in FIG. 2C, the drops partially overlap in the X direction and in the Y direction.

Figure 2D:
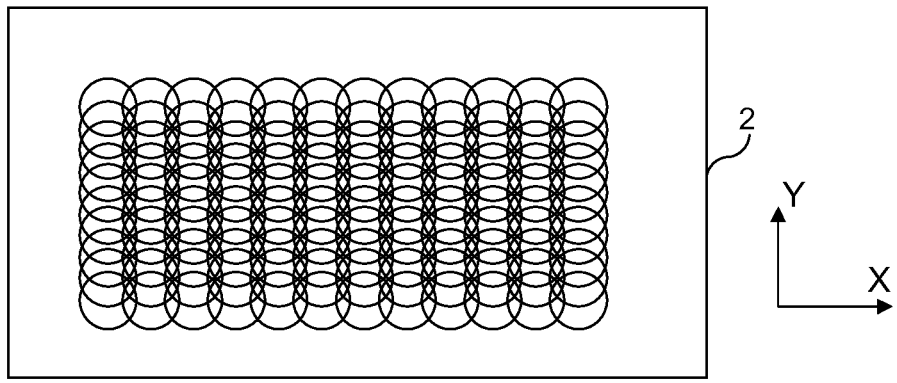

FIG. 2D shows the same part of the substrate 2. Each odd and even printing element ejects a row of drops on the substrate resulting in 10 parallel rows of dots. It is evident that firing with all even and odd printing elements also guarantees a full coverage of the substrate 2. As shown in FIG. 2D, the drops heavily overlap in the X direction and in the Y direction.

Figure 2E:
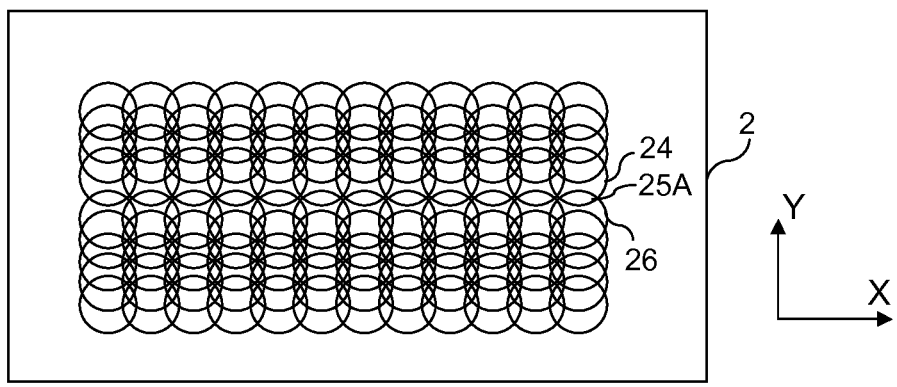

FIG. 2E shows the same part of the substrate 2. Each odd and even printing element is scheduled to eject a row of drops on the substrate resulting in parallel rows of dots. A row of drops of which the last drop was indicated as drop 25 in FIG. 2A, has not been printed due to a failing odd printing element. An area 25A is not covered by dots from this failing printing element. However, since even printing elements neighboring the failing odd printing element are firing drops at the area 25A a full coverage of the substrate 2 is guaranteed.

Figure 2F:
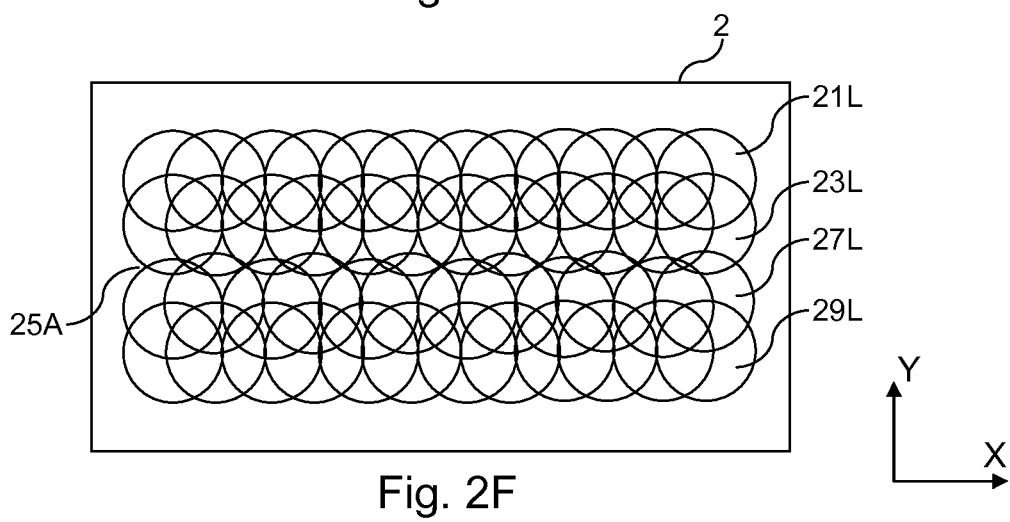

FIG. 2F shows the same part of the substrate 2. It is assumed that the print head 13 is now limited to five (odd) printing elements. There are no even printing elements on the print head 13, so the odd printing elements are all printing elements in this embodiment. Each printing element according to this embodiment is scheduled to eject a row of large drops on the substrate, which rows are parallel to each other. A row of large drops, which is scheduled to be printed, has not been printed due to a failing printing element. An area 25A is not covered by large dots from the failing printing element and extends in the X direction. The other scheduled rows of large drops are ejected on the substrate 2. The last large drops of the other scheduled rows are indicated as large drop 21L, large drop 23L, large drop 27L and large drop 29L, respectively. Firing with all printing elements guarantees a full coverage of the substrate 2. Moreover, FIG. 2F shows that if one printing element is failing, the substrate 2 is still fully covered with dots due to the larger drop size of recording material ejected from the printing elements. Due to the larger drop size of drops ejected from the well functioning printing elements, the area 25A is also fully covered with dots of recording material.

FIGS. 3A-3D are schematic views of printing mask elements according to the present invention.

Figure 3A:
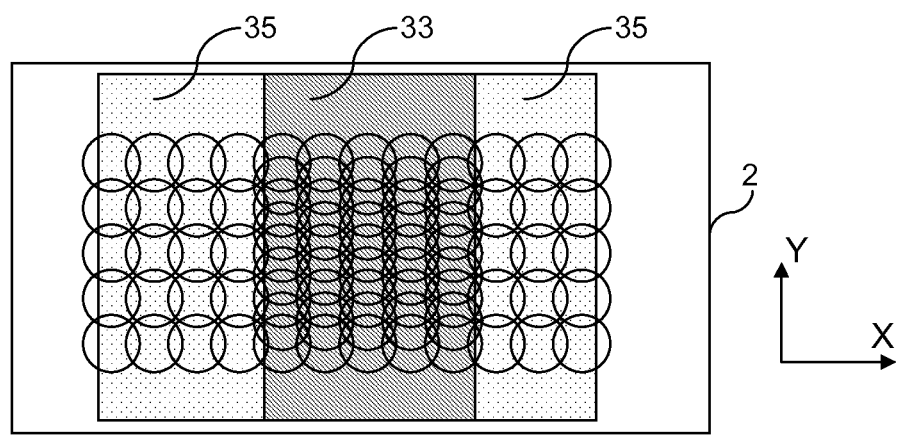
FIGS. 3A-3D are schematic views of printing mask elements according to the present invention.

FIG. 3A shows a part of a substrate 2. By means of the inkjet apparatus, a mask is printed on the substrate. The print head of the inkjet apparatus is moving in the X direction. A first part 35 of the functional pattern on the substrate is identified by a speckled area. The first part 35 may consist of a plurality of sub-parts or consist of a single part. In this example the first part 35 is shown as two sub-parts. The first part 35 corresponds to a non-critical part of the electrical device for which the mask is to be printed on the substrate. At the substrate 2, a second part 33 of the functional pattern on the substrate is identified by a dashed area. The second part 33 may consist of a plurality of sub-parts or of a single part. In this example, the second part 33 is shown as a single part. The second part 33 corresponds to a critical part of the electrical device for which the mask is to be printed on the substrate. The print head is ejecting more drops per unit area at the second part 33 than at the first part 35. Therefore the coverage degree at the second part 33 is higher than the coverage degree at the first part 35. In this example, the print head has at first been moved over a first sub-part of the first part 35 while ejecting recording material from the odd printing elements. At second, the print head has been moved over the second part 33 while ejecting recording material from the odd and even printing elements. At third, the print head has been moved over a second sub-part of the first part 35 while ejecting recording material from the odd printing elements. In this example, no printing element is failing.

Figure 3B:
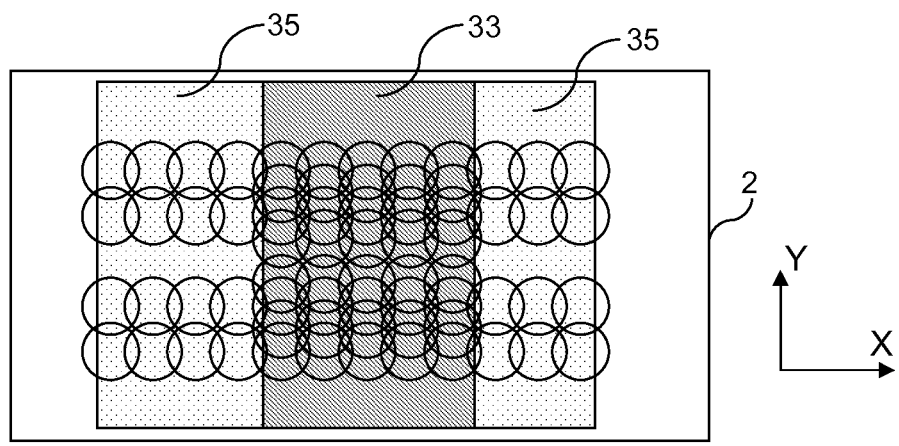

FIG. 3B shows a same part of a substrate 2. By means of the inkjet apparatus, a mask is printed on the substrate. The print head of the inkjet apparatus is moving in the X direction. The print head has a failing odd printing element. This results in an empty row at the first part 35, in the first sub-part as well in the second sub-part of the first part 35. Because of the higher amount of recording material per unit area at the second part 33, failing of the one odd printing element does not result in an empty row in the second part 33. Due to recording material from two neighboring even printing elements, the second part 33 is still fully covered with recording material.

Figure 3C:
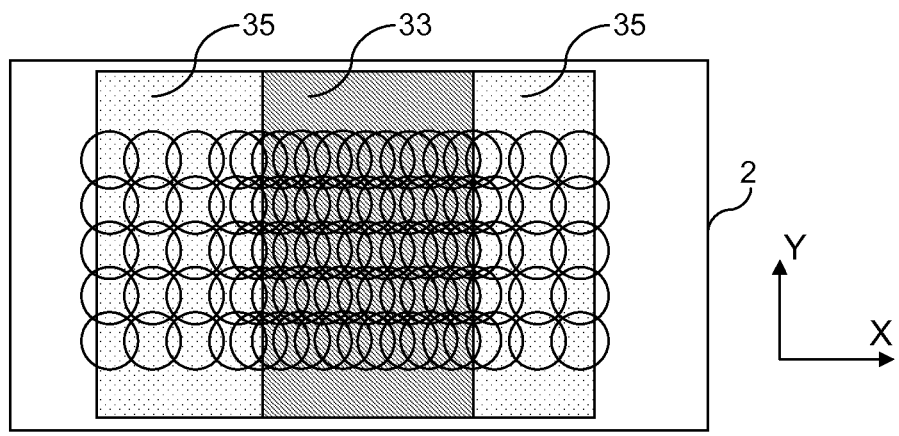

FIG. 3C shows a part of the functional pattern on the substrate 2 comprising the first part 35 and the second part 33.

The print head is ejecting more drops per unit area at the second part 33 than at the first part 35. Therefore, the amount of recording material per unit area at the second part 33 is higher than the amount of recording material per unit area at the first part 35. In this example, the print head has at first been moved over a first sub-part of the first part 35 while ejecting recording material from the odd printing elements at a first drop frequency. At second, the print head has been moved over the second part 33 while ejecting recording material from the odd printing elements at a second drop frequency. The second drop frequency is higher than the first drop frequency. In this example the second drop frequency is twice as high as the first drop frequency. At third, the print head has been moved over a second sub-part of the first part 35 while ejecting recording material from the odd printing elements at the first drop frequency. In this example, no printing element is failing.

Figure 3D:
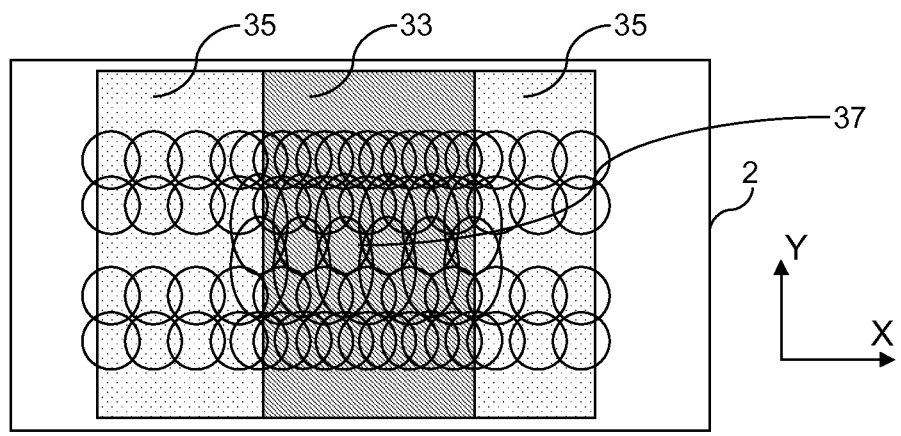

FIG. 3D shows a same part of the functional pattern on the substrate 2. By means of the inkjet apparatus, a mask is printed on the substrate. The print head of the inkjet apparatus is moving in the X direction. The print head has a failing odd printing element. This results in an empty row 37 at the first part 35, in the first sub-part as well in the second sub-part, and in the second part 33. However, because of the higher amount of recording material per unit area at the second part 33, failing of the one odd printing element does in the end not result in an empty row in the second part 33. Because of the higher drop frequency at the second part 33, additional recording material from odd printing elements neighboring the failing odd printing element is spreading to the part of the empty row 37 in the second part 33. By doing so, the second part 33 is still fully covered with recording material. The spreading into the empty row 37 is indicated by elongated oval drops. It is noted that this solution works well when the recording material has a sufficient flowing and spreading behavior. The sufficient flowing and spreading behavior may depend on the type of substrate and the temperature of the substrate as well as the type of recording material.

Figure 4:
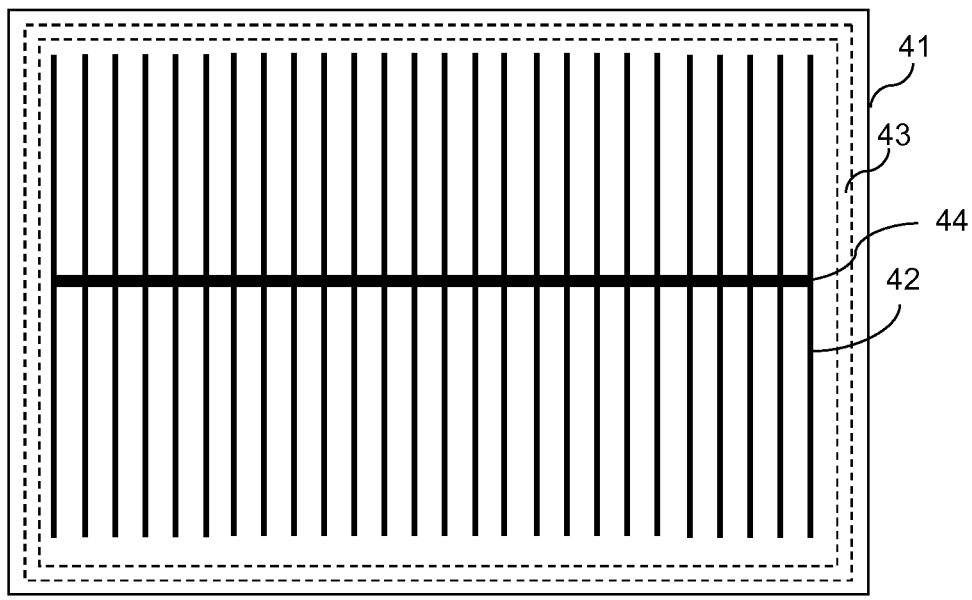
FIG. 4 is a schematic view of a solar cell.

FIG. 4 is a schematic view of a front side of a solar cell. The solar cell comprises a substrate 41 upon which electrodes 42 are extended. The electrodes 42 are connected by a bus bar 44. An area 43 of the solar cell shown between two dashed rectangles near the edges of the solar cell is identified as a critical part of the solar cell. Edge isolation of the solar cell reduces the possibility of leakage or short-circuiting.

Figure 5:
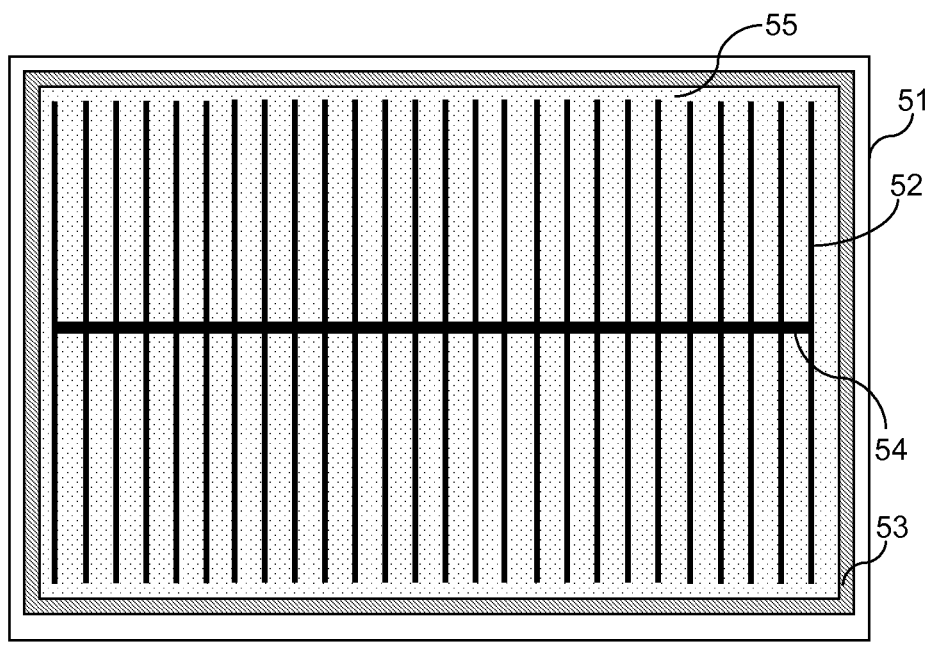
FIG. 5 is a schematic view of a mask for a solar cell including critical and non-critical parts.

FIG. 5 shows a schematic view of a mask for a solar cell comprising a substrate 51 upon which a critical part 53 corresponding to the critical part 43 in FIG. 4 is shown in a cross hatched manner, a non-critical part 55 is shown in a speckled manner and open parts 52, 54 are shown in black corresponding to the electrodes 42 shown in FIG. 4 and the bus bar 44 shown in FIG. 4. The critical part 53 is intended to be covered by recording material, a non-critical speckled part 55 is intended to be covered by recording material and the open parts 52, 54 are intended not to be covered by recording material. The first part according to an embodiment of the method of the invention corresponds to the speckled part 55 and the second part according to a method of the invention corresponds to the cross hatched part 53. The cross hatched part 53 is critical since the edges of the solar cell must isolate the electrodes at the front side of the solar cell shown in FIG. 4 from the back side of the solar cell (not shown). It is therefore crucial that the cross hatched part 53 of the mask, near the edges of the mask, is fully covered with an isolating recording material. This is achieved by printing the cross hatched part 53 at a higher amount of recording material per unit area than the speckled part 55 according to any previous described embodiment of the method according to the invention. The invention is not limited to a positioning of the substrate as shown in FIGS. 4 and 5. The mask may be rotated by 90 degrees, i.e. ½π radians, with respect to the direction of the movement of the print head over the substrate.

Figure 6:
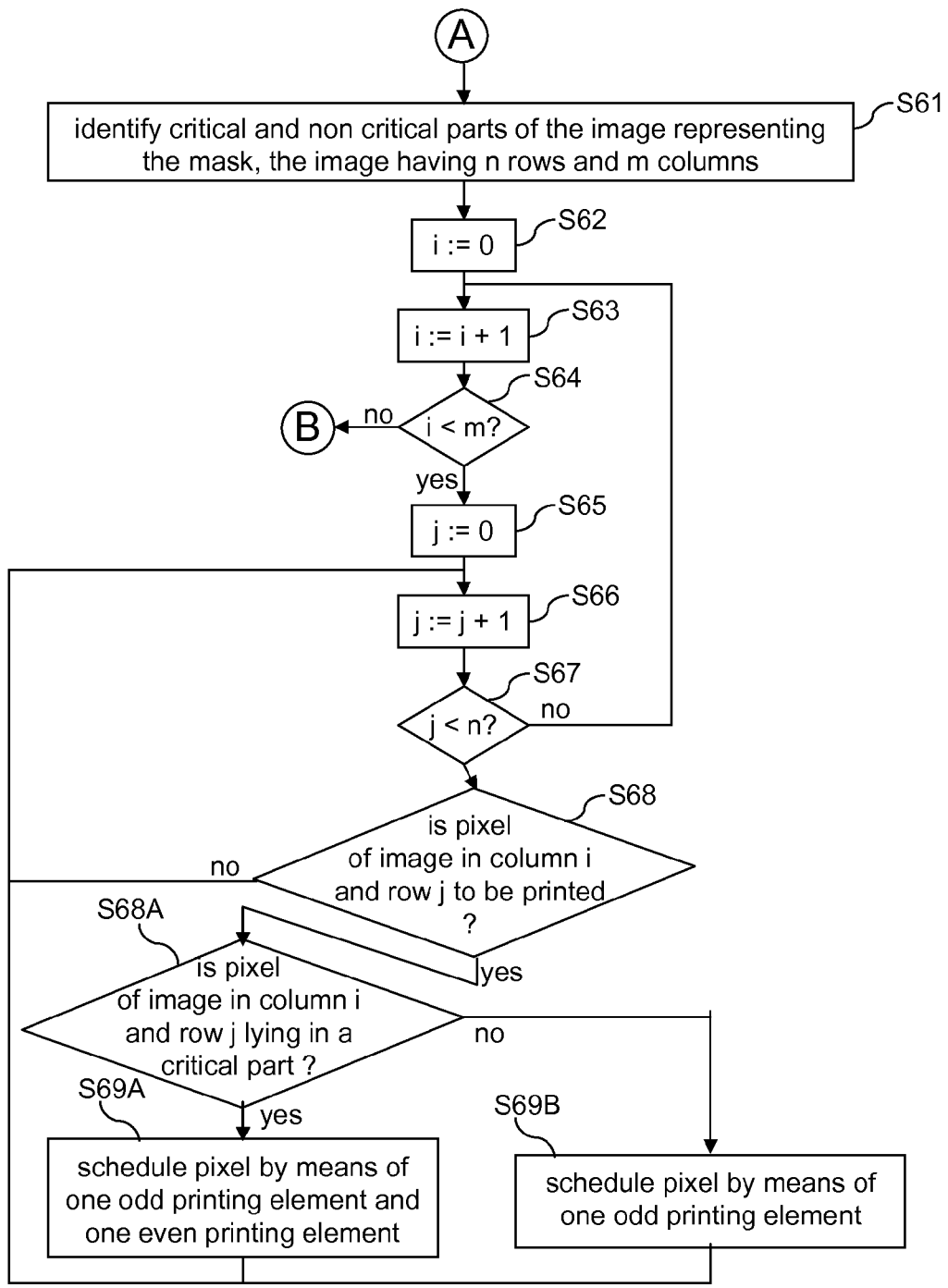
FIGS. 6-7 are flow diagrams of the method of printing the mask according to an embodiment of the present invention.
Figure 7:
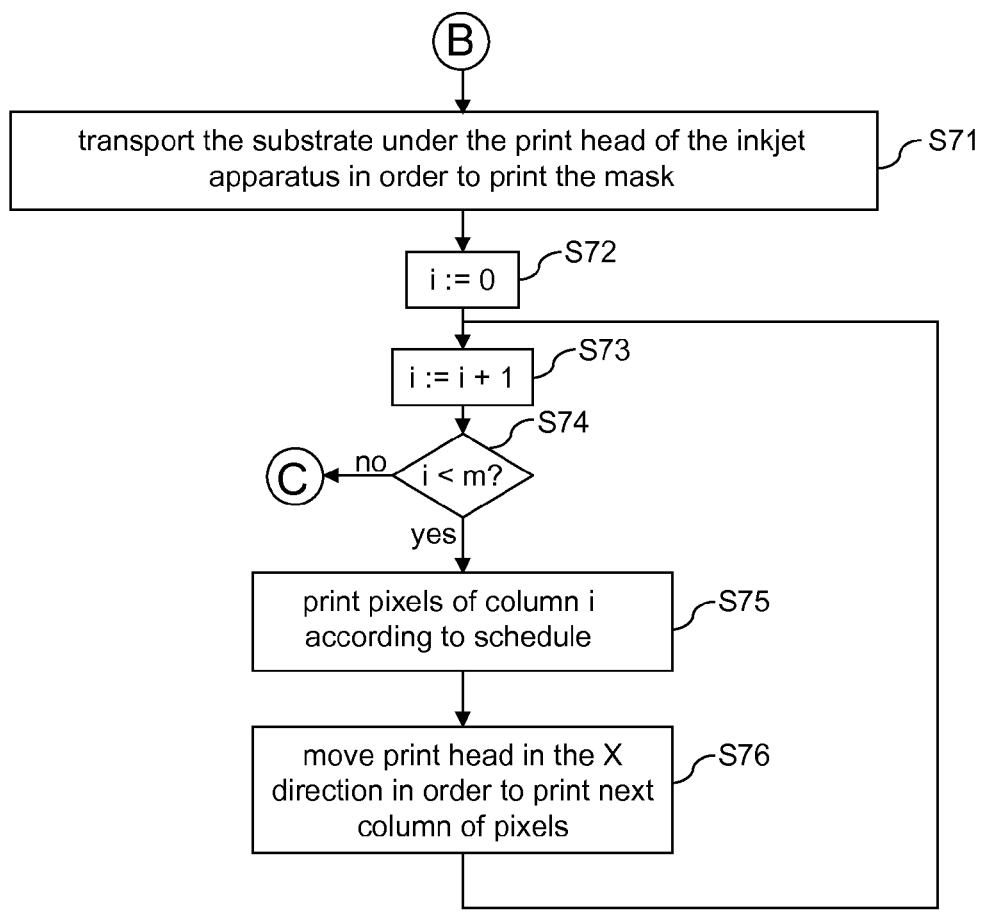

FIGS. 6 and FIG. 7 are flow diagrams of the method of printing the mask according to an embodiment of the invention. Any of the here-above described embodiments of the method may be used for printing a mask, for instance for a production of a solar cell. Instead of directly printing metal contacts by means of screen printing, at first a mask shown in FIG. 5 is printed by an inkjet apparatus on a solar cell substrate according to the method of the invention. The masked substrate is etched and afterwards the etched parts are plated to create the metal contacts.

The method according to the flow diagrams of FIG. 6 and FIG. 7 starts at starting point A. At point A, the control unit of the inkjet apparatus has the image for the mask to be printed in memory. In a first step S61, the control unit identifies critical and non-critical parts of the image corresponding to critical and non-critical parts of the mask for the electrical device to be printed. It is assumed that the image for the mask has n rows and m columns In a second step S62, a column counter i is initialized at zero. In a third step S63, the column counter i is increased by one. In a fourth step S64, it is checked if the column counter i is less than the number of columns m of the image. If not, the last column of the image has been processed and the method proceeds to intermediate point B, which corresponds to starting point B in FIG. 7.

If at the fourth step S64, the column counter i is less than the number of columns m of the image, the method proceeds with a fifth step S65.

In the fifth step S65, a row counter j is initialized at zero. In a sixth step S66, the row counter j is increased by one. In a seventh step S67, it is checked if the row counter j is less than the number of rows n of the image. If not, the last row is reached and the method returns to the third step S63.

If at the seventh step S67 the row counter j is less than the number of rows n of the image, the method proceeds with an eighth step S68. In the eighth step S68, it is checked if the pixel of the image at column i and row j is to be printed at all. If not, the method returns to the sixth step S66. If so, it is checked in a ninth step S68A if the pixel of the image at column i and row j is part of a critical part of the image as identified in the first step S61. If so, the pixel is scheduled by a print head scheduler module of the inkjet apparatus to be printed by means of one odd printing element and one even printing element according to a tenth step S69B. If not, the pixel of the image at column i and row j is part of a non-critical part of the image as identified in the first step S61. The pixel is scheduled by a print head scheduler module of inkjet apparatus to be printed by means of one odd printing element according to a twelfth step S69B. After the pixel is scheduled in the tenth step S69B or the twelfth step S69B, the method returns to the sixth step S66.

After intermediate point B at FIG. 6 has been reached, the method proceeds to starting point B in FIG. 7. In a first step S71, the substrate is transported under the print head of the inkjet apparatus in order to print the mask. Since all pixels of the image are scheduled by the print head scheduler, the print head may start to print the image.

In a second step S72, the column counter i is initialized again at zero. In a third step S73 the column counter i is increased by one. In a fourth step S74, it is checked if the column counter I is less than the number of columns m of the image. If not, the method of printing the mask is completed at end point C, since all columns of the image for the mask have been printed by the print head. If so, the pixels of column i of the image are printed by the print head by means of the corresponding scheduled printing elements of the print head according to a fifth step S75. In a sixth step S76, the print head is moved in the X direction in order to print the next column of pixels, if applicable. After the print head has been moved, the method returns to the third step S73.

For convenience reasons, only one swath of the printing head over the substrate is elucidated in FIGS. 6 and 7. However, it is also part of the invention to produce the mask by means of a plurality of swathes over the substrate. In such an embodiment the procedure as described in FIGS. 6 and 7 has to be repeated as many times as the number of swathes needed to print the complete mask.

The present invention also comprises a method for manufacturing an electrical device, comprising the steps of ejecting recording material on a substrate, which serves as a base for the electrical device in order to form a mask according to a digital image, filling gaps in the mask with a conducting material in order to form electrical circuits of the electrical device, and removing the mask from the substrate, wherein the method further comprises the steps of identifying a first part and a second part of the functional pattern corresponding respectively to a non-critical part and a critical part of the electrical device so as to eject recording material at a higher amount per unit area at the second part of the functional pattern on the substrate than at the first part of the functional pattern on the substrate.

In one embodiment, the steps of the method are carried out by a plating technique. In another embodiment, the steps of the method are carried out by a deposition technique, e.g. a physical vapor deposition or a chemical vapor deposition.

Physical vapor deposition consists of a process in which a material is removed from a target, and deposited on the substrate. Techniques to do this include the process of sputtering in which an ion beam liberates atoms from a target, allowing them to move through the intervening space and deposit on the desired substrate, and evaporation deposition, in which a material is evaporated from a target using either heat (thermal evaporation) or an electron beam (e-beam evaporation) in a vacuum system.

Chemical deposition techniques include chemical vapor deposition ("CVD"), in which a stream of source gas reacts on the substrate to grow the material desired. This can be further divided into categories depending on the details of the technique, for example, LPCVD (Low Pressure chemical vapor deposition) and PECVD (Plasma Enhanced chemical vapor deposition).

The present invention also comprises a method for manufacturing an electrical device, comprising the steps of ejecting recording material on a substrate, which serves as a patterned conducting layer for the electrical device according to a functional pattern, wherein the method further comprises the steps of identifying a first part and a second part of the functional pattern corresponding respectively to a non-critical part and a critical part of the electrical device so as to eject recording material at a higher amount per unit area at the second part of the functional pattern on the substrate than at the first part of the functional pattern on the substrate.

In one embodiment, the critical part of the electrical device is the part that has to be isolated from another part of the electrical device in order to prevent shorts between the two parts.

In another embodiment, the critical part of the device is the part that has to be connected to another part of the electrical device in order to establish conductivity between the two parts.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for printing a functional pattern using a printing apparatus, the printing apparatus applying a recording material on a substrate, the method comprising the steps of:
    determining a first part and a second part of the functional pattern; and
    controlling the printing apparatus to apply a first amount of the recording material per unit area on the substrate to cover the first part and a second amount of the recording material per unit area on the substrate to cover the second part,
    wherein the first amount is larger than or equal to an amount sufficient to cover the substrate per unit area and the second amount is larger than the first amount, and
    wherein the step of applying the recording material on the substrate comprises a first sub-step of applying the first amount of recording material at the first part and at the second part during a first pass of a print head of the printing apparatus over the substrate, and a second sub-step of applying an additional amount of recording material at the second part during a second pass of the print head of the printing apparatus over the substrate, the first amount and the additional amount together forming the second amount.

2. The method according to claim 1, wherein the printing apparatus comprises a print head for applying the recording material by drops on the substrate and the method further comprises the step of controlling the printing apparatus to apply the second amount by using a higher resolution of drops than for applying the first amount.

3. The method according to claim 1, wherein the printing apparatus comprises a print head for applying the recording material by drops on the substrate and the method further comprises the step of controlling the printing apparatus to apply the second amount by using a larger drop size than for applying the first amount.

4. The method according to claim 1, wherein the functional pattern is selected for forming an electrical circuit.

5. The method according to claim 4, wherein the functional pattern represents the electrical circuit or a mask for the electrical circuit.

6. The method according to claim 5, wherein the first part and the second part respectively correspond to an electrically non-critical part and an electrically critical part of the electrical circuit.

7. The method according to claim 6, wherein the second part comprises an edge of a mask or an edge of a gap in a mask.

8. The method according to claim 1, wherein the step of applying the recording material on the substrate is established during one single pass of a print head of the printing apparatus, said one single pass covering the first part and the second part of the substrate.

9. The method according to claim 1, wherein the step of applying the recording material on the substrate comprises a first sub-step of applying the recording material at the first part during a first pass of a print head of the printing apparatus over the substrate and a second sub-step of applying the recording material at the second part during a second pass of the print head of the printing apparatus over the substrate.

10. The method according to claim 5, wherein the functional pattern represents a mask for the electrical circuit and the method further comprises the steps of:
    filling gaps in the mask with a conducting material in order to form the electrical circuit; and
    removing the mask from the substrate.

11. A printing apparatus comprising:
    a print head; and
    a control unit,
    wherein the control unit is configured to have the printing apparatus execute the method according to claim 1.

12. The method according to claim 4, wherein the electrical circuit is part of a solar cell to be manufactured.

13. A non-transitory recording medium comprising computer executable program code configured to instruct a computer to control a printing apparatus to perform the method according to claim 1.

* * * * *